(12) United States Patent
Zordan

(10) Patent No.: US 9,335,621 B2
(45) Date of Patent: May 10, 2016

(54) LITHOGRAPHIC APPARATUS WITH AN OBJECT SUPPORT HAVING ACTUATING STRUCTURES TO APPLY A FORCE AND METHOD FOR OPERATING THE SAME

(75) Inventor: Enrico Zordan, Norwalk, CT (US)

(73) Assignee: ASML HOLDING N.V., Veldhoven (NL)

( * ) Notice: Subject to any disclaimer, the term of this patent is extended or adjusted under 35 U.S.C. 154(b) by 1404 days.

(21) Appl. No.: 13/022,247

(22) Filed: Feb. 7, 2011

(65) Prior Publication Data
US 2011/0194094 A1    Aug. 11, 2011

Related U.S. Application Data

(60) Provisional application No. 61/302,756, filed on Feb. 9, 2010.

(51) Int. Cl.
*G03B 27/58* (2006.01)
*G03F 7/20* (2006.01)

(52) U.S. Cl.
CPC .............. *G03B 27/58* (2013.01); *G03F 7/707* (2013.01)

(58) Field of Classification Search
CPC ....................................................... G03F 7/707
See application file for complete search history.

(56) References Cited

U.S. PATENT DOCUMENTS

| | | | |
|---|---|---|---|
| 6,172,738 B1 | 1/2001 | Korenaga et al. | |
| 6,469,773 B1 | 10/2002 | Iwamoto | |
| 7,151,981 B2 * | 12/2006 | Kurita et al. | 700/218 |
| 7,236,233 B2 | 6/2007 | Heerens et al. | |
| 2005/0117142 A1 | 6/2005 | Heerens et al. | |
| 2007/0188724 A1 * | 8/2007 | Jacobs et al. | 355/53 |

FOREIGN PATENT DOCUMENTS

| | | |
|---|---|---|
| JP | 4-025107 | 1/1992 |
| JP | 9-171246 | 6/1997 |
| JP | 11-162809 | 6/1999 |
| JP | 2005-129959 | 5/2005 |
| JP | 2006-005139 | 1/2006 |

OTHER PUBLICATIONS

Japanese Office Action mailed Aug. 15, 2012 in corresponding Japanese Patent Application No. 2011-020881.

* cited by examiner

*Primary Examiner* — Chia-How Michael Liu
(74) *Attorney, Agent, or Firm* — Pillsbury Winthrop Shaw Pittman LLP

(57) ABSTRACT

A support structure for positioning an exchangeable object in a lithographic apparatus. The support structure has a chuck to support and clamp the object and an actuating structure. The actuating structure may have a first actuating structure (e.g., spring) and a second actuating structure (e.g., linear actuator). The first actuating structure is moveable relative to the chuck and is configured to move the second actuating structure between a first position in contact with a side of the object and a second position out of contact with the side of the object. The second actuating structure is configured to move at least a portion thereof relative to the first actuating structure between a first position in contact with the side of the object and a second position out of contact with the side of the object and to apply a pushing force to the side of the object.

20 Claims, 5 Drawing Sheets

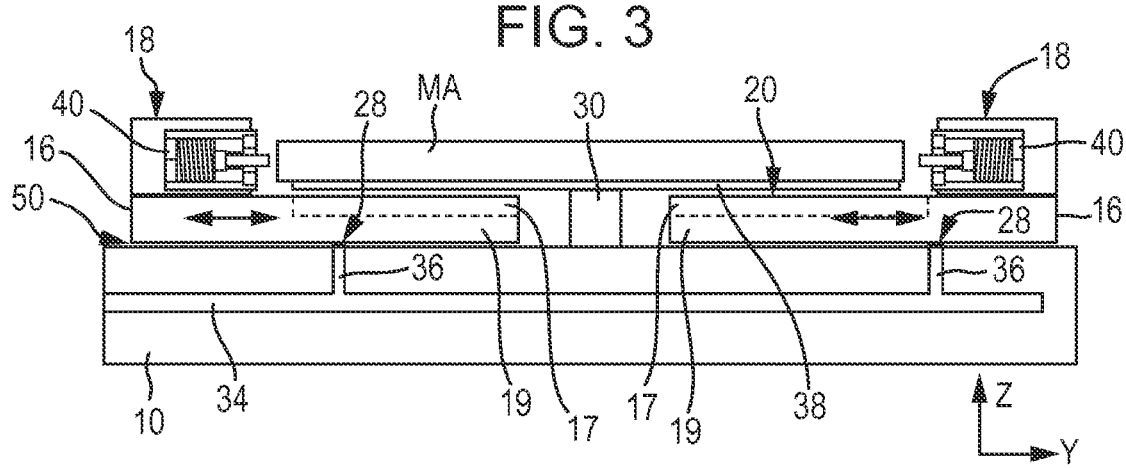
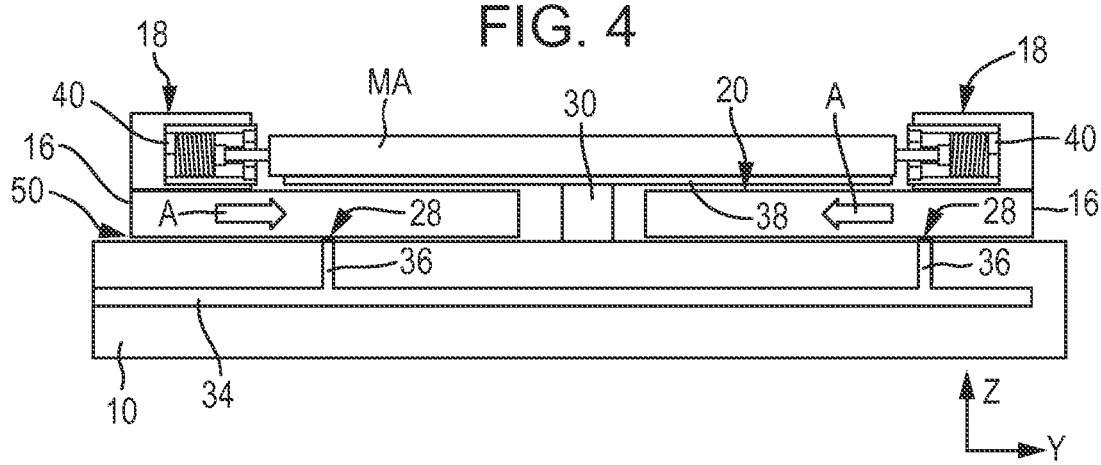
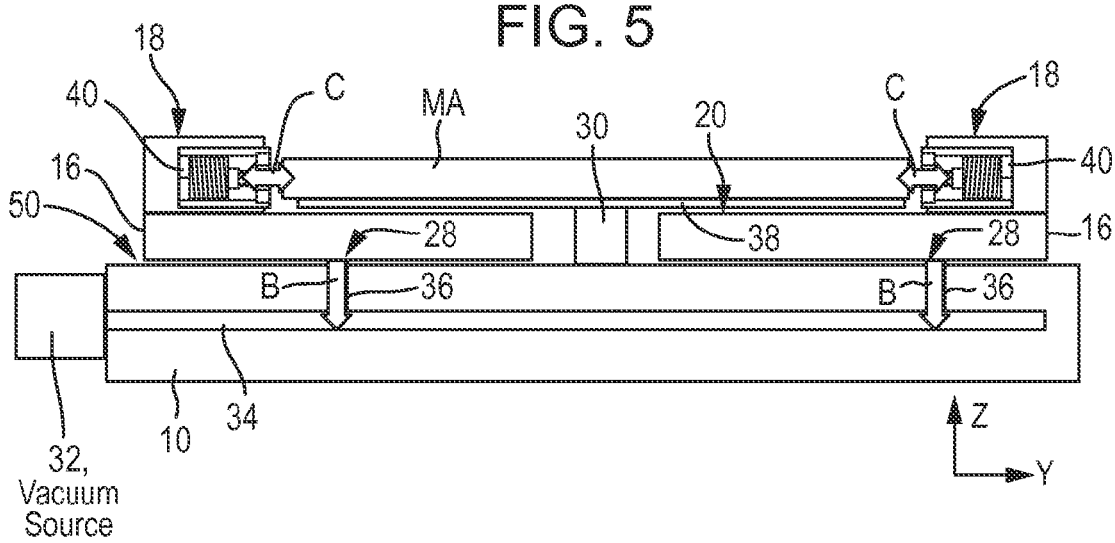

LITHOGRAPHIC APPARATUS WITH AN OBJECT SUPPORT HAVING ACTUATING STRUCTURES TO APPLY A FORCE AND METHOD FOR OPERATING THE SAME

CROSS-REFERENCE TO RELATED APPLICATION

This application claims priority and benefit under 35 U.S.C. §119(e) to U.S. Provisional Patent Application No. 61/302,756, entitled "Lithographic Apparatus with Support for an Object and Method for Positioning Same," filed on Feb. 9, 2010, the content of which is incorporated herein in its entirety by reference.

FIELD

The present invention relates to a lithographic apparatus and a device manufacturing method.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

It is known, for example, to hold a patterning device in the lithographic apparatus by depositing the patterning device on a clamp having one or more vacuum pads and applying a vacuum to pull and generate a normal force between the patterning device and the vacuum pad. The normal force then generates friction force between the vacuum pad and the patterning device. Further, one or more positioners are provided to move the patterning device and the vacuum pad as part of, for example, scanning exposure. In such a circumstance, there is generally is no other device to position or apply a force on the patterning device.

SUMMARY

The above system of clamping is limited by 3 factors: differential pressure, clamping surface, and friction coefficient. For example, the differential pressure in such a system can be limited to be a maximum of 1 bar (atmospheric pressure to vacuum), and so the normal force to generate friction is limited. Also, the surface available for the clamp to apply a clamping force is limited by the size of the patterning device and/or the amount of area of the patterning device devoted to providing the pattern itself. This also limits the normal force that can be generated by the system. Additionally, the friction coefficient between the clamp and patterning device may be limited to approximately 0.25, and currently there are no readily available and practical materials to increase it. A result of the above-noted exemplary limitations is that the positioner system to move the patterning device can apply up to a certain force to the patterning device before slip occurs in the clamping system. Slip will likely result in loss of exposure precision and overlay issues. Current accelerations and speeds of patterning devices mean that the forces applied by the positioner system are close to this limit. However, there is a desire to be able to increase accelerations and speeds to increase throughput of exposed substrates.

A further weakness of this type of clamping system is that the applicable force depends on cleanliness of the interface between the patterning device and the clamp, and on the atmospheric pressure (which depends upon weather, altitude, etc.), all of which are almost unpredictable variables.

Accordingly, an aspect of the invention provides a support structure for positioning an exchangeable object in a lithographic apparatus. The support structure has a chuck to support the exchangeable object and apply a clamping force to the exchangeable object, and a first actuating structure and a second actuating structure. The first actuating structure is moveable relative to the chuck and is configured to move the second actuating structure between a first position in contact with a side of the exchangeable object and a second position out of contact with the side of the exchangeable object. The second actuating structure is configured to move at least a portion thereof relative to the first actuating structure between a first position in contact with the side of the exchangeable object and a second position out of contact with the side of the exchangeable object and to apply a pushing force to the side of the exchangeable object.

According to an aspect of the invention, there is provided a lithographic apparatus arranged to transfer a pattern from a patterning device onto a substrate. The lithographic apparatus has a chuck to support an exchangeable object and apply a clamping force to the exchangeable object, and a first actuating structure and a second actuating structure. The first actuating structure is moveable relative to the chuck and is configured to move the second actuating structure between a first position in contact with a side of the exchangeable object and a second position out of contact with the side of the exchangeable object. The second actuating structure is configured to move at least a portion thereof relative to the first actuating structure between a first position in contact with the side of the exchangeable object and a second position out of contact with the side of the exchangeable object and to apply a pushing force to the side of the exchangeable object.

According to another aspect of the invention, there is provided a support structure for positioning an exchangeable object in a lithographic apparatus. The support structure has a chuck to support the exchangeable object and apply a clamping force to the exchangeable object and an actuating structure that is configured to apply a pushing force to a side of the exchangeable object. The actuating structure has a spring and a linear actuator. The spring is configured to apply force to the linear actuator to move the linear actuator relative to the chuck.

According to a further aspect of the invention, there is provided a method for positioning an object within a lithographic apparatus. The method includes: loading the object onto a chuck, of the lithographic apparatus and applying a clamping force to the object to clamp the object to the chuck; moving a first actuating structure relative to the chuck toward the object so as to move a second actuating structure into contact with the object; moving at least a portion of the second actuating structure relative to the first actuating structure between a first position in contact with the side of the object and a second position out of contact with the side of the object; and applying a pushing force to the side of the object using second actuating structure.

BRIEF DESCRIPTION OF THE DRAWINGS

Embodiments of the invention will now be described, by way of example only, with reference to the accompanying schematic drawings in which corresponding reference symbols indicate corresponding parts, and in which:

FIGS. 3-5 illustrate sectional views of the support structure of FIG. 2 and a method to handle an object on the support structure according to an embodiment of the invention;

DETAILED DESCRIPTION

Figure 1:
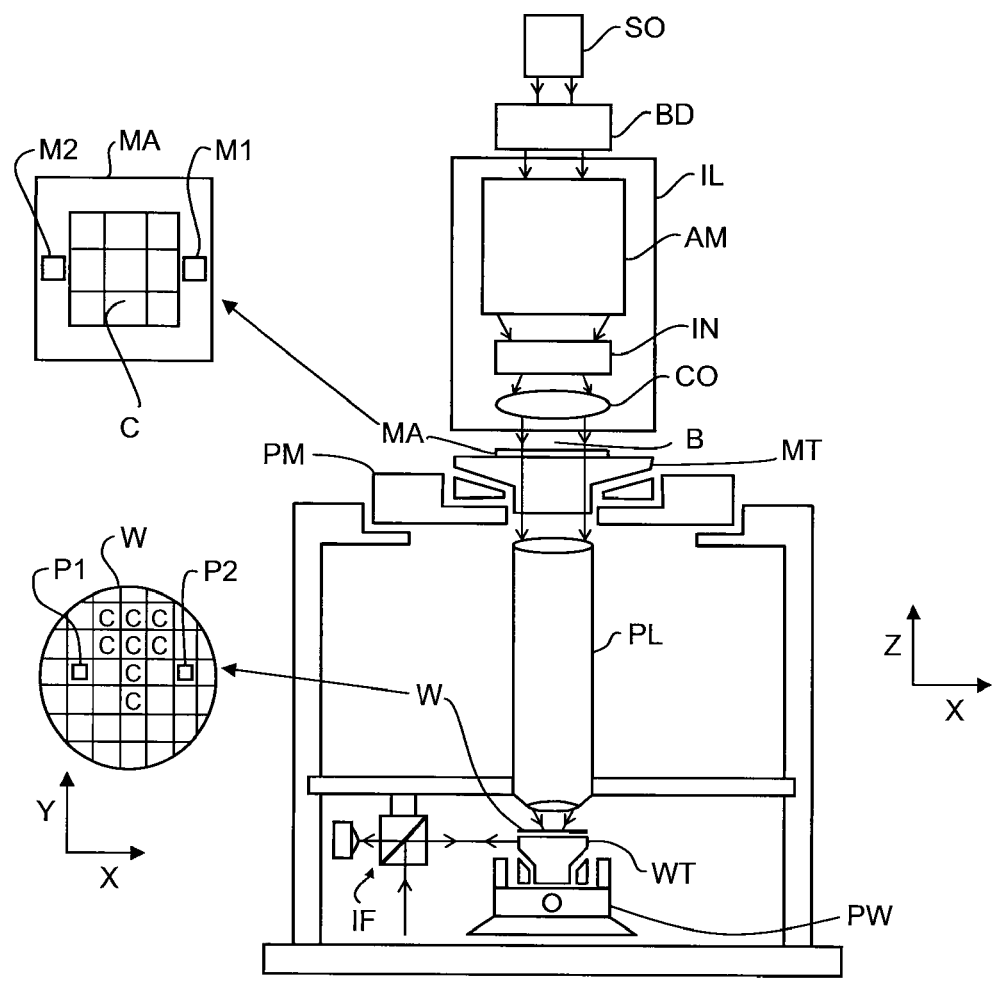
FIG. 1 schematically depicts a lithographic apparatus according to an embodiment of the invention.

FIG. 1 schematically depicts a lithographic apparatus according to one embodiment of the invention. The apparatus comprises:

an illumination system (illuminator) IL configured to condition a radiation beam B (e.g. UV radiation or DUV radiation);

a support structure (e.g. a mask table) MT constructed to hold a patterning device (e.g. a mask) MA and connected to a first positioner PM configured to accurately position the patterning device in accordance with certain parameters;

a substrate table (e.g. a wafer table) WT constructed to hold a substrate (e.g. a resist-coated wafer) W and connected to a second positioner PW configured to accurately position the substrate in accordance with certain parameters; and a projection system (e.g. a refractive projection lens system) PS configured to project a pattern imparted to the radiation beam B by patterning device MA onto a target portion C (e.g. comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure MT holds the patterning device in a manner that depends on the orientation of the patterning device, the design of the lithographic apparatus, and other conditions, such as for example whether or not the patterning device is held in a vacuum environment. The support structure MT can use mechanical, vacuum, electrostatic or other clamping techniques to hold the patterning device. The support structure MT may be a frame or a table, for example, which may be fixed or movable as required. The support structure MT may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables (and/or two or more support structures). In such "multiple stage" machines the additional tables/support structures may be used in parallel, or preparatory steps may be carried out on one or more tables/support structures while one or more other tables/support structures are being used for exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may comprise an adjuster AD configured to adjust the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as an integrator IN and a condenser CO. The illuminator may be used to condition the radiation beam, to have a desired uniformity and intensity distribution in its cross-section.

The radiation beam B is incident on the patterning device (e.g., mask) MA, which is held on the support structure (e.g., mask table) MT, and is patterned by the patterning device. Having traversed the patterning device MA, the radiation beam B passes through the projection system PS, which focuses the beam onto a target portion C of the substrate W. With the aid of the second positioner PW and position sensor IF (e.g. an interferometric device, linear encoder or capacitive sensor), the substrate table WT can be moved accurately, e.g. so as to position different target portions C in the path of the radiation beam B. Similarly, the first positioner PM and another position sensor (which is not explicitly depicted in FIG. 1) can be used to accurately position the patterning device MA with respect to the path of the radiation beam B, e.g. after mechanical retrieval from a mask library, or during a scan. In general, movement of the support structure MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the support structure MT may be connected to a short-stroke actuator only, or may be fixed. Patterning device MA and substrate W may be aligned using patterning device alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device MA, the patterning device alignment marks may be located between the dies.

The depicted apparatus could be used in at least one of the following modes:

1. In step mode, the support structure MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the support structure MT and the substrate table WT are scanned synchronously while a pattern imparted to the radiation beam is projected onto a target portion C (i.e. a single dynamic exposure). The velocity and direction of the substrate table WT relative to the support structure MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the support structure MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror, array of a type as referred to above.

Combinations and/or variations on the above described modes of use or entirely different modes of use, may also be employed.

While the discussion herein focuses on a patterning device, the structures, methods and concepts discussed herein may be suitably applied to one or more other objects. The patterning device is an embodiment of such an object.

As discussed above, a patterning device is typically held by a support structure MT. A first positioner PM is connected to the support structure MT so as to position the patterning device. In an embodiment, the first positioner PM is configured to accurately position the patterning device in up to 6 degrees of freedom and may comprise a plurality of actuators that enable the positioning of the patterning device. And, In an embodiment, the support structure MT comprises a chuck. In use, the chuck holds the patterning device (or other object). The chuck may be integral in the support structure MT (thus the support structure MT is essentially the chuck) or it may be (removably) mounted thereto. In general, devices and methods for mounting and moving the chuck (e.g., using a control apparatus) are known.

Figure 2:
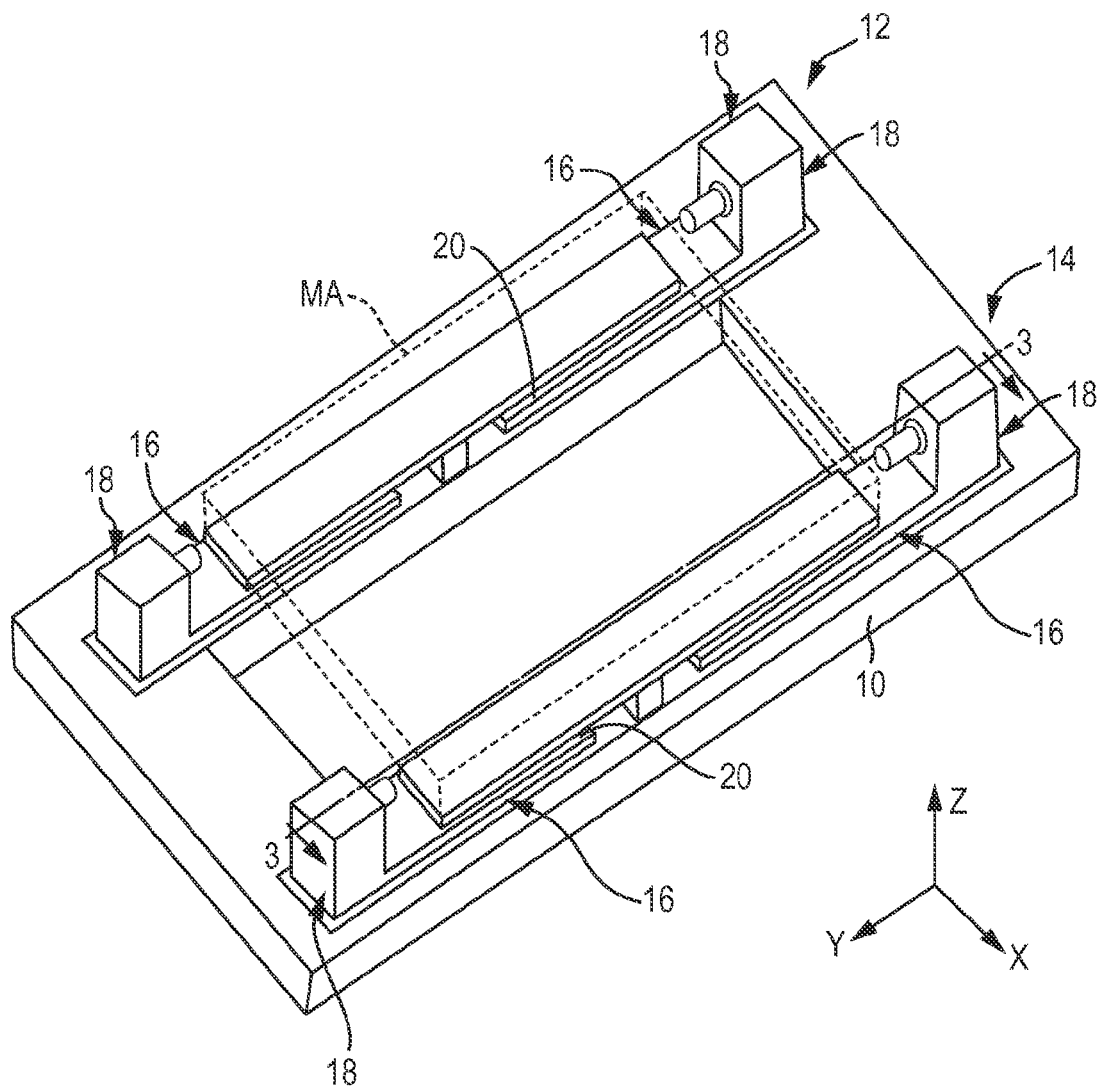
FIG. 2 depicts a perspective, view of a support structure to support an object in the apparatus of FIG. 1 according to an embodiment of the invention.

In an embodiment, the chuck is a support structure to support an exchangeable object (e.g., patterning device MA) in a lithographic apparatus. FIG. 2 depicts a perspective view of a chuck in the form of support structure to support an object in the apparatus of FIG. 1. Generally, the chuck is configured to hold and position the object when the beam of radiation used to expose the substrate is projected in the lithographic apparatus. In particular, the chuck is movable by the positioner PM to move both the chuck and the patterning device thereon.

The chuck 10 has an object surface on which an object, such as patterning device MA, may be mounted and clamped using a clamping device. In accordance with an embodiment, chuck 10 comprises at least a first clamping mechanism 12 and a second clamping mechanism 14. As discussed further below, in an embodiment of the invention, the clamping mechanisms 12, 14 can clamp the object to the chuck and apply an additional pushing force to the patterning device.

Each clamping mechanism 12 and 14 may comprise one or more long range motion parts and one or more short range motion parts. In the non-limiting illustrated embodiment, long range motion parts are shown in the form of first actuating structures 16 and short range motion parts are shown in the form of second actuating structures 18. The first actuating structures 16 and second actuating structures 18 are configured to contact an object on two sides (e.g., opposite sides of the object each extending along the X-axis) of the object.

First actuating structures 16 hold the second actuating structures 18 and are configured to move the second actuating structures 18 relative to the chuck. The first actuating structures comprise a surface 20, which in an embodiment may be located under the object (when the object is held on the chuck), and may itself or in connection with other parts receive the object. As noted above, the second actuating structures 18 are configured to move relative to the chuck and also are moveable as whole or in part relative to the first actuating structures. The first actuating structures 16 of the clamping mechanisms 12, 14 are also arranged to move relative to the chuck 10 (e.g., upon receipt of an object on the surfaces). For example, such movement may be necessary to receive the patterning device MA or to facilitate accurate positioning of the patterning device MA for exposure. Generally, each first actuating structure 16 is linearly movable for a number of millimeters (e.g., along the X- or Y-axis). In an embodiment, the travel range of motion of each first actuating structure 16 may be between a first end furthest in relation to an object and a second end (e.g., closer) in relation to the object. In an embodiment, each first actuating structure 16 may have a travel range of motion between approximately 0.1 millimeters (mm) to approximately 0.5 millimeters (mm). In an embodiment, the travel range is approximately 0.3 millimeters (mm). First actuating structures 16 need not necessitate very accurate positioning. In some embodiments, first actuating structures 16 are configured to move only when the object is loaded and unloaded thereon.

Additionally, first actuating structures 16 are configured to move second actuating structures 18 between a first position in contact with an object and a second position out of contact with an object. The first position and second position may be defined by a certain travel range of motion for the second actuating structures 18. As discussed further herein, the movement of first actuating structures 16 and second actuating structures 18 of the clamping mechanism 12 and 14 allow the object (e.g., patterning device MA) to be removed and/or exchanged. The first actuating structures 16 may bring second actuating structures 18 into contact with the object after a new object is loaded onto the chuck. The second actuating structures 18 are capable of applying a pushing force to the object. In the illustrated embodiment, second actuating structures 18 comprise a plurality of actuation devices with one actuation device provided at each corner (4) of the chuck 10 adjacent the first actuating structures 16.

In accordance with an embodiment, the lithographic apparatus may comprise a low pressure source (such as vacuum source 32, shown in FIG. 5) to apply a low pressure (e.g., vacuum) to one or more channels to hold at least the object in place (e.g., for exposure). A low pressure supply device 30 (shown in FIGS. 3-5) may be used to apply the low pressure directly to the object. In an embodiment, a clamp plate 38 is connected to the low pressure supply device 30. The clamp plate 38 has one or more holes or openings therein which are used to apply and direct the low pressure force to an underside (e.g., a side substantially perpendicular to opposite sides of the object each extending along the X-axis) of the object and pull the object towards it. In an embodiment, the clamp plate 38 is located above surface 20 (and its parts) of the first actuating structures 16 and the first actuating structures 16 are movable relative to the clamp plate 38. As described in greater detail with reference to FIGS. 3-5, the low pressure force may also be applied through channels 34 and 36 of the chuck 10 to hold each of the first actuating structures 16 in a position to prevent their movement relative to the chuck 10.

FIGS. 3-5 illustrate sectional views of the support structure of FIG. 2 and a method to handle an object on the support structure according to an embodiment. FIGS. 3-5 illustrate sectional views taken along line 3-3 in FIG. 2 of the chuck 10, first actuating structure 16 and second actuating structures 18, and the method of handling an object on the support structure in accordance with an embodiment. As shown in FIG. 2, when an object is absent from the chuck 10, the first actuating structure 16 is positioned to receive the object, for example, when located at a furthest outward end of its travel range in relation to the object, and the second actuating structures 18 (e.g., linear actuators 46) are idle. An object is then loaded onto the first actuating structure 16 and chuck 10 as shown in FIG. 3 using, for example, robotic handler (not shown) known in the art. In this position, the second actuating structures 18 may be optionally moved to a partially extended position toward the object (e.g. in the Y direction). For example, in an embodiment, the linear actuators 46 and their respective extension portion 48 may be moved from a furthest end of its travel range to a midpoint (halfway in its travel range). The first actuating structure 16 may then be moved toward the object relative to the chuck 10 (as indicated by arrows A) until the second, actuating structures 18 (e.g., an end of extension portion 48) are in the first position and in contact with the object, as shown in FIG. 4.

The first actuating structure 16 is then locked in position on the chuck 10 using, for example, a low pressure, as shown in FIG. 5. The low pressure source 32 applies a low pressure force through one or more channels 36 via one or more channels 34. The low pressure force applied pulls a bottom part of the first actuating structures 16 in a downward direction (as indicated by arrows B) into contact with a top surface of the chuck 10 at their interface 50. The low pressure applied is such that a normal force and friction coefficient are able to generate a friction force between first actuating structures 16 and chuck 10, so that it can sustain the force applied on the object without sliding or moving substantially. As discussed above, low pressure force is also used to hold the object towards the clamp plate 38.

Once the low pressure is applied and the object and first actuating structures 16 are secure, the second actuating structures 18 are moved relative to the first actuating structures 16 to its second position out of contact with the object. This may be performed before exposure, for example. In an embodiment, the linear actuators 46 are retracted to an idle position within its travel range (e.g., a halfway point). Contact between the second actuating structures 18 and the object is lost. This provides a small gap between the actuators 46 and object to allow, for example, thermal expansion.

After the object is secure, the scanning and exposure process may be started to expose a substrate in the lithographic apparatus. When a force needs to be applied to the patterning device (e.g., during scanning motion) to avoid, for example, slip, the linear actuators 46 are actuated to contact the patterning device through, e.g., extension portion 48. The linear actuators 46 then can apply the force to the object. When force is not required, the linear actuators 46 may be actuated to come out of contact with the object.

When the object is removed or exchanged, the linear actuators 46 of the second actuating structures 18 are retracted into the housing from the first position to the second position. The low pressure force from the low pressure source 32 is released, and the first actuating structures 16 are moved away from the object. The object may then be lifted or removed.

In an embodiment, one or more bearings may be provided to assist in the movement of the first actuating structure 16 (and its parts) relative to the chuck 10. In an embodiment, the bearing may be a gas (e.g., air) bearing between the chuck 10 and the first actuating structures 16 (e.g., on an underside of the first actuating structures 16 as shown in FIG. 3) which may facilitate the moving and relative action.

Figure 8:
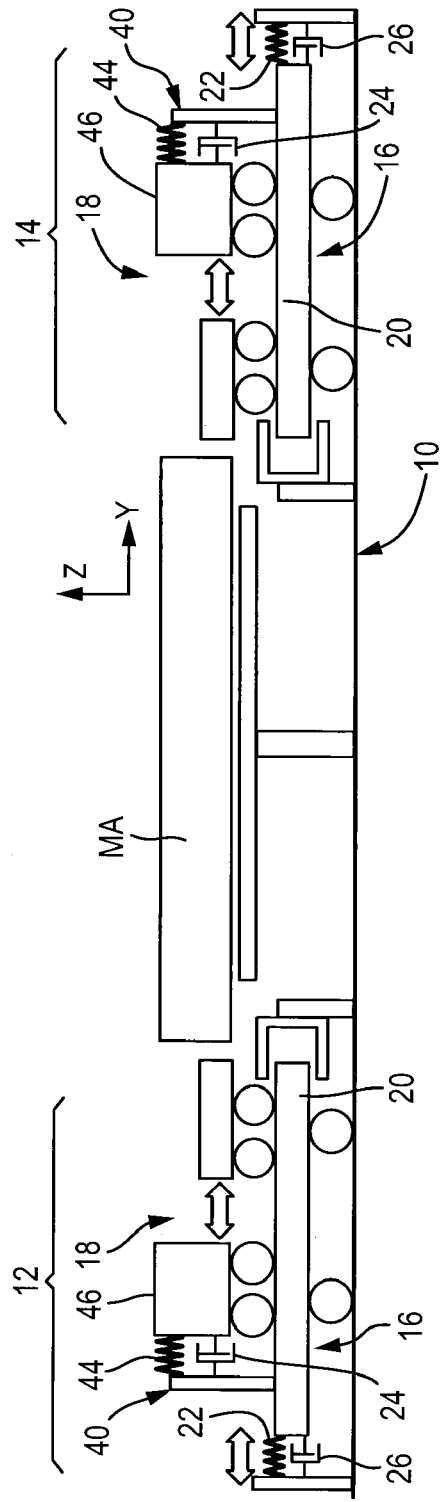
FIGS. 8-9 illustrate alternate diagrams of the support structure of FIG. 2.
Figure 9:
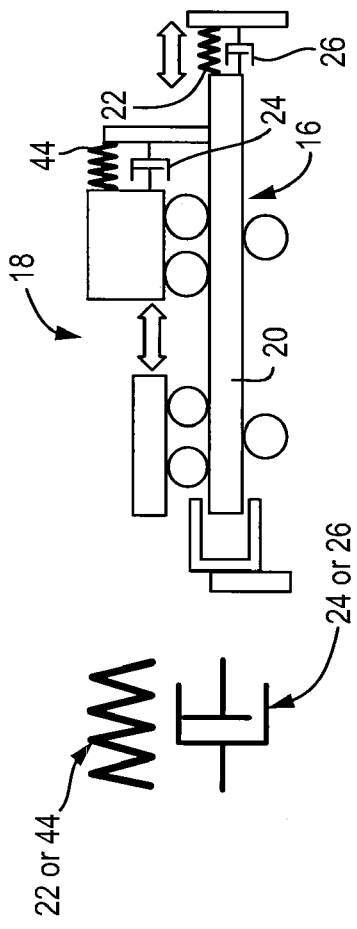

The first actuating structure 16 may include a spring 22 (having a damping in of itself or additionally provided by a damper 26) as shown in FIGS. 8 and 9. Spring 22 acts in a similar manner as the below-described spring 44. That is, spring 22 of first actuating structure may be provided to allow for positioning of surface 20 and its related parts to receive an object and/or positioning of the second actuating structures 18 so that they can be used to secure the object.

In accordance with an embodiment, each first actuating structure 16 may comprise multiple parts, such as a first slider part 17 and a second slider part 19. For example, at least one of the first and second slider parts 17 and/or 19 may be configured to move linearly in the Y direction (e.g., along the Y-axis) relative to the chuck 10 and/or relative to each other. The first slider part 17 and/or second slider part 19 may move upon receipt of the object to the chuck. In an embodiment, the first slider 17 part and second slider part 19 may have corresponding surfaces such that the slider parts may correspondingly fit together to form at least part of the surface for receiving the object. A relative motion between the first and second slider parts 17 and 19 may be caused by a dedicated motion device designed to move first and/or second slider part. Also, for example, the first actuating structure 16 may include one or more openings therein. The openings are configured to direct and apply the low pressure force from the low pressure source (e.g., vacuum) to parts of the object, for example. These openings may be positioned such that they are adjacent one or more openings of the chuck 10 and thus configured to communicate the low pressure force (e.g., vacuum) to the object.

In an embodiment, the first actuating structures 16 are arranged to support the second actuating structures 18. In an embodiment, the first actuating structures 16 and the second actuating structures 18 are configured to be attached/connected to one another. For example, with reference, to FIG. 2, a second actuating structure 18 may be attached at either end of the first actuating structure 16. In an embodiment, at least a portion (e.g., a housing for its components) of the second actuating structure 18 may be integrally formed with a part (e.g., a slider part) of the first actuating structure 16.

Figure 6:
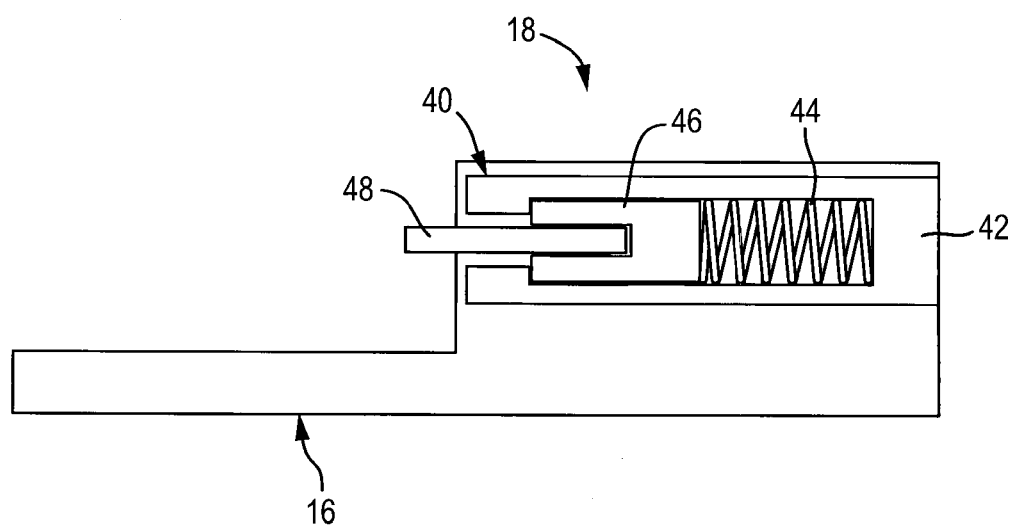
FIGS. 6-7 illustrate a detailed view of an actuation device used in the support structure of FIG. 2-5 according to an embodiment of the invention.
Figure 7:
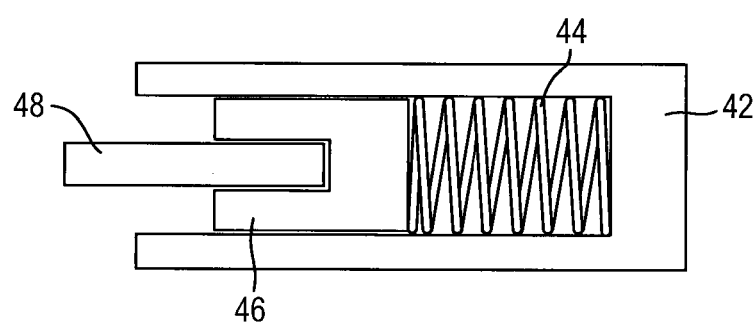

As previously noted, in the exemplary illustrated embodiment, second actuating structures 18 are provided at each corner. Using the second actuating structures 18 at each of the corners as described herein allows for application of pushing force to edges of the object during motion of the object to, e.g., limit stress on the first actuating structures 16 due to a low pressure clamp. For example, each of the second actuating structures 18 may comprise an actuation device 40. FIGS. 6-7 illustrate a more detailed view of the actuation device (e.g., mounted with the first actuating structure 16 and alone, respectively). Each actuation device 40 is capable of applying a desired force to the object. The movement of each actuation device 40 may be defined by a certain travel range of motion (e.g., between and including a first position in contact with an object and a second position out of contact with an object, and any additional position therebetween).

Each actuation device 40 may comprise a housing 42, a spring 44 (having a damping in of itself or additionally provided by a damper 24), and a linear actuator 46 (see FIGS. 8 and 9). The housing 42 at least partially encloses the spring 44 and linear actuator 46. The spring 44 is configured to push the linear actuator 46 against the housing 42, as well as a portion thereof out from housing 42, so that at least an extension portion 48 of the linear actuator 46 may be moved between the first position (in contact with an object) and the second position (out of contact with the object). The linear actuator 46 may be actuated (e.g., expanded or contracted) to cause a portion thereof, e.g., extension portion 48, to be in contact with an object at the first position to, apply force to it, or out of contact with the object (e.g., see arrows C of FIG. 5). In an embodiment, the linear actuator 46 may comprise a piezoelectric device or material. The linear actuator 46 is configured to apply a constant force when in contact with an object. When force on the object is not required, an end of the extension portion 48 is retracted to the second position so that there is no contact with the object.

The spring 44 may have a stiffness so that it may be preloaded to a maximum force that is allowed to be applied to the object and to push the linear actuator 46 against the housing 42. In some embodiments, this preload can be made adjustable through an adequate design of the components. The spring 44 has an elastic constant such that it provides almost a constant force over the entire displacement range of the linear actuator 46.

For example, when force has to be applied to the object, i.e., when the object is loaded and ready for positioning, the linear actuator 46 expands or extends to reach the object (e.g., via extension portion 48) and pushes or exerts a force on the object. If the force exerted on the object exceeds a preload, the spring 44 can start deforming so that the force on the object remains about constant, independent of the further expansion of the linear actuator 46.

The travel range of motion of the actuation devices 40 of the second actuating structures 18 may be determined by the features of the housing 42, spring 44, and linear actuator 46 of each actuation device 40. For example, in an embodiment, the range may be limited by the amount of, space within the housing 42 that the spring 44 and linear actuator 46 can move. In another embodiment, the range may be defined by the spring constant and/or stiffness that allows for expansion and retraction of the linear actuator 46. Also, the type of actuator 46 used may determine the travel range of motion of the actuation devices 40. However, such features should not be limiting. For example, in an embodiment, the range of motion of each actuation device 40 may be relatively short (e.g., 10-30 microns).

Each actuation device 40 may be configured such that it has a certain natural frequency for use. For example, in an embodiment, the actuation device 40 comprises a natural frequency of approximately 2.5 KHz. Each device 40 and its components may also be manufactured or adjusted accordance with known requirements to obtaining accurate alignment of an object. For example, in an embodiment, the housing 42 may comprise a stiffness that is approximately greater than $1.5 \times 10^6$ N/m. Spring 44 may be preloaded to a force between and including approximately 20 N to approximately 25 N. The stiffness of spring 44 may also be set as desired. In an embodiment, the stiffness of spring 44 is approximately greater than $1.5 \times 10^5$ N/m. The travel distance and/or change in length of the spring 44 when moving with respect to housing 42 may be up to and including approximately 10 micrometers ($\mu$m). Also, actuator 46 may apply a force of approximately greater than 30 N, have a travel range between and including approximately 10 microns to, approximately 30 microns, a mass of approximately 15 g to approximately 20 g, and a stiffness that is approximately greater than $1.5 \times 10^6$ N/m. However, these parameters are not meant to be limiting and are only exemplary. The features associated with each component should not be limiting. For example, the range at which the extension portion 48 and/or the linear actuator 46 is to be extended and/or retracted is not meant to be limiting. In some instances, the actuator 46 may be partially extended to approximately one-third of its total extension range (e.g., approximately 10 microns). In another embodiment, actuator 46 may be partially extended to approximately one-half of its total extension range (e.g., approximately 15 microns).

The actuating structures allow for a determined amount of force to be applied to an object to prevent slip and ratcheting (e.g., due to an excessive stress on the clamp plates 38 via low pressure source 32). Preventing such issues allow overlay specifications related to positioning patterning devices to be met.

Generally the impact on the overall support structure/chuck design should be relatively small, especially as compared to other alternatives. The addition of the described actuating structures may add additional mass to the chuck, but may also be dependent upon the design of the actuating structures. Potentially the added mass may be similar to that of an object (e.g., patterning device MA) or approximately five percent (5%) of the total mass of the chuck 10. The herein described actuating structures are relatively simple to implement while allowing for better results (i.e., accurate positioning). In an embodiment where piezoelectric actuators are used in second actuating structures 18, thermal issues may be substantially reduced and/or eliminated.

Also, the use of the spring 44 (with its stiffness) aids to maintain the force on the object when needed. That is, the spring 44 aids in keeping the force applied by the linear actuator 46 to the object to remain substantially constant. The combination of the spring and linear actuator also assists in allowing movement of each actuation device 40 within an entire travel range of motion. This can help compensate for any object expansion (e.g., during positioning) and make each actuation device 40 similar to a pure force actuator. Furthermore, when the actuation devices 40 are moved to the second position out of contact with the object, the area or gap around the object allows for stress relief and thermal expansion (e.g., related to deformity of the object, changes during projection of a beam of radiation/exposure, changes during positioning, etc.). Additionally, the structures used with first actuating structure 16 (e.g., spring 22) aid in positioning of surface 20 and its related parts to receive an object and/or positioning of the second actuating structures 18 so that they can be used to secure the object.

Also, the described actuating structures are not limited by differential pressure, surface availability for the clamp, and friction coefficients. The normal force to generate friction at the interface of the first actuating structures 16 and chuck 10 is not limited.

Besides the embodiments shown, it will be appreciated that numerous variant embodiments are possible. For example, it is to be understood that in embodiments chuck 10, first actuating structures 16, and second actuating structures 18 may configured to hold a patterning device MA on the support structure (e.g., mask table) MT, or a substrate on the substrate table WT. The chuck may also be used to hold and position another object, such as a mirror, within the lithographic apparatus. The chuck and first and second actuating structures described herein may be used in lithographic tools that do not contain projection optics, such as in an imprint lithography tool, in a maskless lithography tool, as well as in lithography tools with projection optics designs substantially different from this example.

FIGS. 8 and 9 depict a spring-mass-damper model/system of the support structure show in FIGS. 2-5. From FIGS. 8 and 9, the various parts described above and their positional relationship can be clearly seen. Further, FIGS. 8 and 9 also show the relative motions, actuators and spring/dampers.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The lithographic apparatus may also be of a type wherein a surface of the substrate is immersed in a liquid having a relatively high refractive index, e.g. water, so as to fill a space between a final element of the projection system and the substrate. Immersion liquids may also be applied to other spaces in, the lithographic apparatus, for example, between the patterning device and a first element of the projection system. Immersion techniques are well known in the art for increasing the numerical aperture of projection systems.

The terms "radiation" and "beam" used herein encompass all types of electromagnetic radiation, including ultraviolet (UV) radiation (e.g. having a wavelength of or about 365, 248, 193, 157 or 126 nm) and extreme ultra-violet (EUV) radiation (e.g. having a wavelength in the range of approximately 5-20 nm), as well as particle beams, such as ion beams or electron beams The term "lens", where the context allows, may refer to any one or combination of various types of optical components, including refractive, reflective, magnetic, electromagnetic and electrostatic optical components.

Accordingly, a support structure for positioning an exchangeable object in a lithographic apparatus is disclosed. The support structure comprises: a chuck to support the exchangeable object and apply a clamping force to the exchangeable object; and a first actuating structure and a second actuating structure. The first actuating structure is moveable relative to the chuck and configured to move the second actuating structure between a first position in contact with a side of the exchangeable object and a second position out of contact with the side of the exchangeable object. The second actuating structure is configured to move at least a portion thereof relative to the first actuating structure between a first position in contact with the side of the exchangeable object and a second position out of contact with the side of the exchangeable object and to apply a pushing force to the side of the exchangeable object.

In an embodiment, the exchangeable object is a patterning device and the chuck is moveable.

In an embodiment, the support structure further comprises a channel to communicate a low pressure to hold the first actuating structure in a position to prevent movement relative to the chuck In another embodiment, the first actuating structure comprises a first slider part and a second slider part, and the first slider part and/or the second slider part is/are configured to move linearly relative to the chuck, and upon receipt of the exchangeable object to the chuck. In an embodiment, the first slider part and the second slider part have corresponding surfaces such that the first and second slider parts correspondingly fit together to form a surface underneath the exchangeable object.

In another embodiment, the second actuating structure comprises a spring and a linear actuator. The spring is configured to apply force to the linear actuator to move the linear actuator relative to the first actuating structure. In an embodiment, the spring and linear actuator are arranged to apply a substantially constant force during motion of the exchangeable object. In another embodiment, the linear actuator is configured to move a portion thereof to come in or out of contact with the exchangeable object. In yet another embodiment, the linear actuator is piezoelectric.

A lithographic apparatus arranged to transfer a pattern from a patterning device onto a substrate is also disclosed. The apparatus comprises: a chuck to support an exchangeable object and apply a clamping force to the exchangeable object; and a first actuating structure and a second actuating structure. The first actuating structure is moveable relative to the chuck and configured to move the second actuating structure between a first position in contact with a side of the exchangeable object and a second position out of contact with the side of the exchangeable object. The second actuating structure is configured to move at least a portion thereof relative to the first actuating structure between a first position in contact with the side of the exchangeable object and a second position out of contact with the side of the exchangeable object and to apply a pushing force to the side of the exchangeable object.

In an embodiment, the apparatus further comprises: a support structure configured to support the patterning device, the patterning device configured to provide a patterned beam of radiation; a substrate table configured to hold the substrate; and a projection system configured to project the patterned beam onto a target portion of the substrate.

In an embodiment, the exchangeable object is a patterning device and the chuck is moveable.

In another embodiment, the first actuating structure comprises a first slider part and a second slider part. The first slider part and/or the second slider part is/are configured to move linearly relative to the chuck, and upon receipt of the exchangeable object to the chuck.

In an embodiment, the second actuating structure comprises a spring and a linear actuator. The spring is configured to apply force to the linear actuator to move the linear actuator relative to the first actuating structure. In an embodiment, the spring and linear actuator are arranged to apply a substantially constant force during motion of the exchangeable object. In another embodiment, the linear actuator is configured to move a portion thereof to come in or out contact with the exchangeable object. In yet another embodiment, the linear actuator is piezoelectric.

A support structure for positioning an exchangeable object in a lithographic apparatus is also disclosed. The support structure comprises: a chuck to support the exchangeable object and apply a clamping force to the exchangeable object; and an actuating structure configured to apply a pushing force to a side of the exchangeable object, the actuating structure comprising a spring and a linear actuator, the spring configured to apply force to the linear actuator to move the linear actuator relative to the chuck.

In an embodiment, the spring and linear actuator are arranged to apply a substantially constant force during motion of the exchangeable object. In another embodiment, the linear actuator is configured to move a portion thereof to come in or out contact with the exchangeable object. In yet another embodiment, the linear actuator is piezoelectric.

A method for positioning an object within a lithographic apparatus is also disclosed. The method comprises: loading the object onto a chuck of the lithographic apparatus and applying a clamping force to the object to clamp the object to the chuck; moving a first actuating structure relative to the chuck toward the object so as to move a second actuating structure into contact with the object; moving at least a portion of the second actuating structure relative to the first actuating structure between a first position in contact with the side of the object and a second position out of contact with the side of the object; and applying a pushing force to the side of the object using second actuating structure.

While specific embodiments of the invention have been described above, it will be appreciated that the invention may be practiced otherwise than as described. For example, the invention may take the form of a computer program containing one or more sequences of machine-readable instructions configured to cause performance of a method as disclosed above, or a computer-readable data storage medium (e.g. semiconductor memory, magnetic or optical disk) having such a computer program stored therein.

The descriptions above are intended to be illustrative, not limiting. Thus, it will be apparent to those skilled in the art that modifications may be made to the invention as described without departing from the scope of the claims set out below.

What is claimed is:

1. A support structure to position an exchangeable object in a lithographic apparatus, the support structure comprising:
   a chuck to support the exchangeable object and apply a clamping force to the exchangeable object; and
   a first actuating structure and a second actuating structure, the first actuating structure moveable relative to the chuck and configured to move the second actuating structure linearly between a first position in contact with a side of the exchangeable object and a second position out of contact with the side of the exchangeable object; and
   the second actuating structure configured to linearly move at least a portion thereof relative to the first actuating structure and to at least part of the second actuating structure, between the first position in contact with the side of the exchangeable object and the second position out of contact with the side of the exchangeable object and to apply a pushing force to the side of the exchangeable object.

2. The support structure of claim 1, wherein the exchangeable object is a patterning device and the chuck is moveable.

3. The support structure of claim 1, further comprising a channel to communicate a low pressure to hold the first actuating structure in a position to prevent movement relative to the chuck.

4. The support structure of claim 1, wherein the first actuating structure comprises a first slider part and a second slider part, the first slider part and/or the second slider part configured to move linearly relative to the chuck, and upon receipt of the exchangeable object to the chuck.

5. The support structure of claim 4, wherein the first slider part and the second slider part have corresponding surfaces such that the first and second slider parts correspondingly fit together to form a surface underneath the exchangeable object.

6. The support structure of claim 1, wherein the second actuating structure comprises a spring and a linear actuator, the spring configured to apply force to the linear actuator to move the linear actuator relative to the first actuating structure and to the at least part of the second actuating structure.

7. The support structure of claim 6, wherein the spring and the linear actuator are arranged to apply a substantially constant force during motion of the exchangeable object.

8. The support structure of claim 6, wherein the linear actuator is configured to move a portion thereof to come in or out of contact with the exchangeable object.

9. The support structure of claim 6, wherein the linear actuator is piezoelectric.

10. A lithographic apparatus arranged to transfer a pattern from a patterning device onto a substrate, the apparatus comprising:
a chuck to support an exchangeable object and apply a clamping force to the exchangeable object; and
a first actuating structure and a second actuating structure, the first actuating structure moveable relative to the chuck and configured to move the second actuating structure linearly between a first position in contact with a side of the exchangeable object and a second position out of contact with the side of the exchangeable object; and
the second actuating structure configured to linearly move at least a portion thereof relative to the first actuating structure and to at least part of the second actuating structure, between the first position in contact with the side of the exchangeable object and the second position out of contact with the side of the exchangeable object and to apply a pushing force to the side of the exchangeable object.

11. The apparatus of claim 10, further comprising:
a support structure configured to support the patterning device, the patterning device configured to provide a patterned beam of radiation;
a substrate table configured to hold the substrate; and
a projection system configured to project the patterned beam onto a target portion of the substrate.

12. The apparatus of claim 10, wherein the exchangeable object is the patterning device and the chuck is moveable.

13. The apparatus of claim 10, wherein the first actuating structure comprises a first slider part and a second slider part, the first slider part and/or the second slider part configured to move linearly relative to the chuck, and upon receipt of the exchangeable object to the chuck.

14. The apparatus of claim 10, wherein the second actuating structure comprises a spring and a linear actuator, the spring configured to apply force to the linear actuator to move the linear actuator relative to the first actuating structure and to the at least part of the second actuating structure.

15. The apparatus of claim 14, wherein the spring and the linear actuator are arranged to apply a substantially constant force during motion of the exchangeable object.

16. A support structure to position an exchangeable object in a lithographic apparatus, the support structure comprising:
a chuck to support the exchangeable object and apply a clamping force to the exchangeable object;
an extension portion configured to move linearly between a first position in contact with a side of the exchangeable object and a second position out of contact with the side of the exchangeable object; and
an actuating structure configured to apply a pushing force to the side of the exchangeable object, the actuating structure comprising a spring and a linear actuator, the spring configured to apply force to the linear actuator to move at least part of the linear actuator and the extension portion relative to the chuck and the linear actuator configured to move the extension portion relative to the at least part of the linear actuator.

17. The support structure of claim 16, wherein the spring and the linear actuator are arranged to apply a substantially constant force during motion of the exchangeable object.

18. The support structure of claim 16, wherein the linear actuator is configured to move a portion thereof to come in or out contact with the exchangeable object.

19. The support structure of claim 16, wherein the linear actuator is piezoelectric.

20. A method of positioning an object within a lithographic apparatus, the method comprising:
loading the object onto a chuck of the lithographic apparatus and applying a clamping force to the object to clamp the object to the chuck;
moving a first actuating structure relative to the chuck toward the object so as to linearly move a second actuating structure into contact with the object;
linearly moving at least a portion of the second actuating structure relative to the first actuating structure and to at least part of the second actuating structure between a first position in contact with the side of the object and a second position out of contact with the side of the object; and
applying a pushing force to the side of the object using the second actuating Structure.

* * * * *